(12) United States Patent
Shimizu et al.

(10) Patent No.: US 11,272,080 B2
(45) Date of Patent: Mar. 8, 2022

(54) VIBRATION DEVICE FOR DUST REMOVAL AND IMAGING DEVICE

(71) Applicant: CANON KABUSHIKI KAISHA, Tokyo (JP)

(72) Inventors: Yasushi Shimizu, Fujisawa (JP); Takanori Matsuda, Chofu (JP); Shinya Koyama, Tokyo (JP); Makoto Kubota, Yokohama (JP); Akira Uebayashi, Tokyo (JP); Kanako Oshima, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 496 days.

(21) Appl. No.: 16/260,506

(22) Filed: Jan. 29, 2019

(65) Prior Publication Data

US 2019/0246013 A1 Aug. 8, 2019

(30) Foreign Application Priority Data

Feb. 6, 2018 (JP) .............................. JP2018-019222

(51) Int. Cl.
*H01L 41/18* (2006.01)
*H04N 5/217* (2011.01)
(Continued)

(52) U.S. Cl.
CPC ......... *H04N 5/2171* (2013.01); *B06B 1/0603* (2013.01); *B06B 1/0607* (2013.01);
(Continued)

(58) Field of Classification Search
CPC ... H01L 41/187; H01L 41/1871; H01L 41/09; H01L 41/042; B06B 1/0603;
(Continued)

(56) References Cited

U.S. PATENT DOCUMENTS 3,325,743 A * 6/1967 Blum ...................... H03F 13/00
330/5
8,182,713 B2 5/2012 Ren et al.
(Continued)

FOREIGN PATENT DOCUMENTS

CN 102107199 A 6/2011
CN 102714273 A 10/2012
(Continued)

OTHER PUBLICATIONS

First Office Action in Chinese Application No. 201910108214.3 (dated Nov. 2020).
(Continued)

*Primary Examiner* — J. San Martin
(74) *Attorney, Agent, or Firm* — Venable LLP

(57) ABSTRACT

A vibration device comprises a vibrating member having at least n (n≥2) piezoelectric elements arranged on a vibrating plate, each of the piezoelectric elements being formed by using a lead-free piezoelectric material and electrodes, wherein if the temperature that maximizes the piezoelectric constant of the piezoelectric material of each of the n piezoelectric elements is expressed as $T_m$ (m being a natural number between 1 and n), at least two of $T_1$ through $T_n$ differ from each other.

11 Claims, 9 Drawing Sheets

(51) Int. Cl.
- *G02B 27/00* (2006.01)
- *B06B 1/06* (2006.01)
- *B08B 7/02* (2006.01)
- *H01L 41/04* (2006.01)
- *H01L 41/09* (2006.01)
- *H01L 41/187* (2006.01)
- *H04N 5/232* (2006.01)

(52) U.S. Cl.
CPC .............. *B08B 7/02* (2013.01); *B08B 7/028* (2013.01); *G02B 27/0006* (2013.01); *H01L 41/042* (2013.01); *H01L 41/09* (2013.01); *H01L 41/1871* (2013.01); *H04N 5/23293* (2013.01)

(58) Field of Classification Search
CPC ......... B06B 1/0607; B08B 7/02; B08B 7/028; G02B 27/0006; H04N 5/2171; H04N 5/23293
See application file for complete search history.

(56) References Cited

U.S. PATENT DOCUMENTS

| | | | |
|---|---|---|---|
| 8,866,952 B2* | 10/2014 | Shimizu | H04N 5/2171 348/340 |
| 8,966,704 B2 | 3/2015 | Ifuku et al. | |
| 8,980,010 B2 | 3/2015 | Ifuku et al. | |
| 9,022,531 B2 | 5/2015 | Kubota et al. | |
| 9,022,534 B2 | 5/2015 | Yabuta et al. | |
| 9,082,975 B2 | 7/2015 | Kubota et al. | |
| 9,082,976 B2 | 7/2015 | Kubota et al. | |
| 9,209,382 B2 | 12/2015 | Glazunov et al. | |
| 9,306,149 B2 | 4/2016 | Hayashi et al. | |
| 9,343,650 B2 | 5/2016 | Kubota et al. | |
| 9,431,595 B2 | 8/2016 | Fauruta et al. | |
| 9,571,709 B2 | 2/2017 | Ifuku et al. | |
| 9,614,141 B2 | 4/2017 | Shimizu et al. | |
| 9,660,174 B2 | 5/2017 | Murakami et al. | |
| 9,893,268 B2 | 2/2018 | Matsuda et al. | |
| 10,593,235 B2 | 3/2020 | Ifuku et al. | |
| 2009/0085440 A1 | 4/2009 | Nakamura | |
| 2015/0349236 A1 | 12/2015 | Fauruta et al. | |
| 2017/0155035 A1 | 6/2017 | Matsuda et al. | |
| 2017/0373244 A1 | 12/2017 | Yabuta et al. | |
| 2018/0233655 A1 | 8/2018 | Saito et al. | |
| 2019/0245135 A1 | 8/2019 | Kubota et al. | |

FOREIGN PATENT DOCUMENTS

| | | |
|---|---|---|
| CN | 103372537 A | 10/2013 |
| CN | 104584249 A | 4/2015 |
| CN | 104871328 A | 8/2015 |
| EP | 3 240 055 A1 | 11/2017 |
| JP | 2009-215111 A | 9/2009 |
| JP | 4724584 B2 | 7/2011 |

OTHER PUBLICATIONS

Kubota et al., U.S. Appl. No. 16/263,290, filed Jan. 31, 2019.
CN 102107199, U.S. Pat. Nos. 8,966,704 B2, 8,980,010 B2, 9,571,709 B2, 10,593,235 B2.
CN 102714273, U.S. Pat. No. 9,209,382 B2.
CN 104871328, U.S. Pat. No. 9,431,595 B2 (already of record), 2015/0349236 A1 (already of record).
CN 104584249, U.S. Pat. No. 9,660,174 B2.
CN 103372537, U.S. Pat. No. 8,866,952 B2.
Extended European Search Report in European Application No. 19155527.5 (dated May 16, 2019).
Saburo Nagakura et al. (ed.), Iwanami Dictionary of Physics and Chemistry, 5th Edition, p. 1268-1269 (Iwanami Shoten, Publishers; Feb. 20, 1998).

* cited by examiner

FIG. 3A
FIG. 3B
FIG. 3C
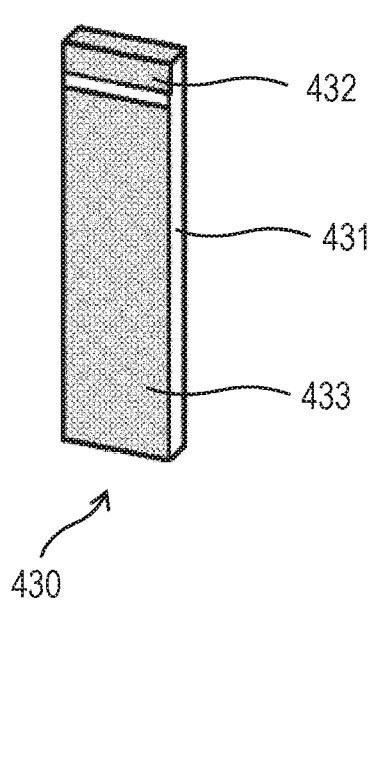
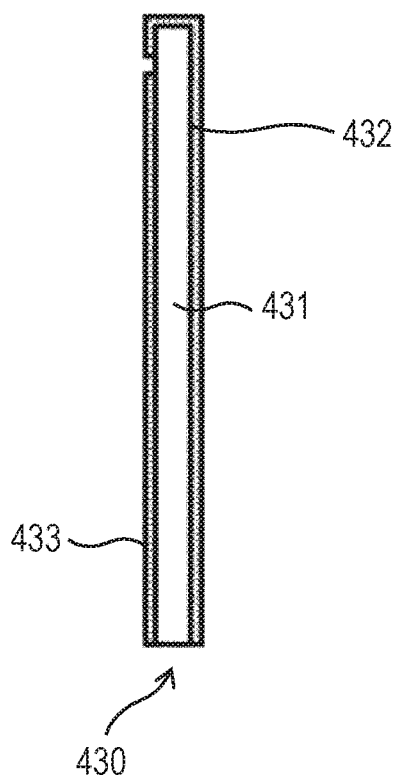
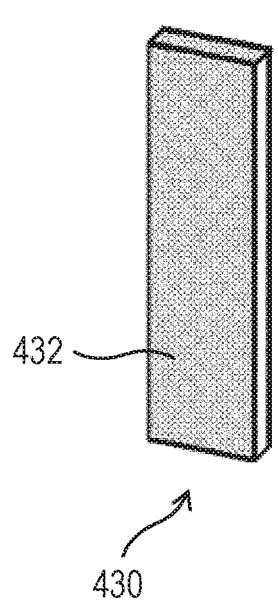

VIBRATION DEVICE FOR DUST REMOVAL AND IMAGING DEVICE

BACKGROUND OF THE INVENTION

Field of the Invention

The present invention relates to a vibration device for dust removal and also to an imaging device equipped with such a vibration device. More particularly, the present invention relates to a vibration device for dust removal that is designed to remove foreign objects such as dusts adhering to the surfaces of the optical parts incorporated in an imaging device such as a digital camera or an image reading device such as a scanner by means of vibrations and also to an imaging device equipped with such a vibration device.

Description of the Related Art

An imaging device such as a digital camera for picking up and recording an image by converting an image signal into an electric signal receives an imaging light flux by means of the image pick up device, which may typically be a CCD (charge coupled device) or a CMOS (complementary metal oxide semiconductor) it comprises. Then, the photoelectric conversion signal output from the image pickup device is converted into image data, which image data is then recorded in a recording medium such as a memory card. In such an imaging device, a cover glass, an optical low pass filter, an infrared absorption filter and other parts are arranged in front (on the subject side) of the image pickup device to form an image pickup unit there.

In an imaging device of the above-described type, when foreign objects such as dusts adhere to any of the surfaces of the cover glass and the filters of the image pickup unit, those foreign objects block the incident light flux and are picked up as black spots in the recorded image. Particularly, in the case of a digital single-lens reflex camera, the dusts that are produced when the shutter, the quick return mirror and/or some other part arranged near the image pickup unit is mechanically driven to operate can adhere, if partly, to any of the surfaces of the cover glass and the filters. Additionally, when the lens is being replaced, foreign objects such as dusts can get into the inside of the camera main body by way of the opening of the lens mount and adhere to any of the surfaces of the cover glass and the filters. However, when each of the cover glass and the filters is equipped with a piezoelectric element and the piezoelectric element is made to operate as a vibrating plate that give rise to elastic vibrations (to be referred to as flexural vibrations hereinafter) in the thickness direction, it can be made to operate as a dust removal device for removing the dusts adhering to the surfaces thereof. Each of Japanese Patent No. 4,724,584 and Japanese Patent Application Laid-Open No. 2009-215111 discloses a dust removal device of the above-identified type, an imaging device equipped with such a dust removal device and an image reading device also equipped with such a dust removal device.

More specifically, Japanese Patent No. 4,724,584 discloses a device for removing the dusts adhering to the surfaces of each of the optical parts (the low pass filter, the infrared absorption filter) of an imaging device by providing the optical part with a piezoelectric element and causing the piezoelectric element to give rise to flexural vibration waves in the thickness direction of the optical part. PZT (lead zirconate titanate), which is a typical piezoelectric ceramic material, is more often than not employed as the piezoelectric material of such piezoelectric elements. However, since there is deep concern over that the lead contained in PZT as principal ingredient thereof adversely affects the environment, it is highly desirable to use a piezoelectric material that does not contain any lead for such piezoelectric elements. Japanese Patent Application Laid-Open No. 2009-215111 discloses the use of a lead-free piezoelectric material such as BZT-BCT (barium calcium titanate zirconate) to meet the demand for such lead-free piezoelectric materials.

SUMMARY OF THE INVENTION

Thus, in an aspect of the present invention, there is provided a vibration device comprising a vibrating member having at least n (n≥2) piezoelectric elements arranged on a vibrating plate, each of the piezoelectric elements being formed by using a lead-free piezoelectric material and electrodes, wherein, if the temperature that maximizes the piezoelectric constant of the piezoelectric material of each of the n piezoelectric elements is expressed as $T_m$ (m being a natural number from 1 to n), at least two of $T_1$ through $T_n$ differ from each other.

Further features of the present invention will become apparent from the following description of exemplary embodiments with reference to the attached drawings.

BRIEF DESCRIPTION OF THE DRAWINGS

FIGS. 3A, 3B and 3C are a schematic illustration of an exemplar piezoelectric element that can be used in an embodiment of vibration device according to the present invention, illustrating the configuration thereof.

DESCRIPTION OF THE EMBODIMENTS

Figure 1:
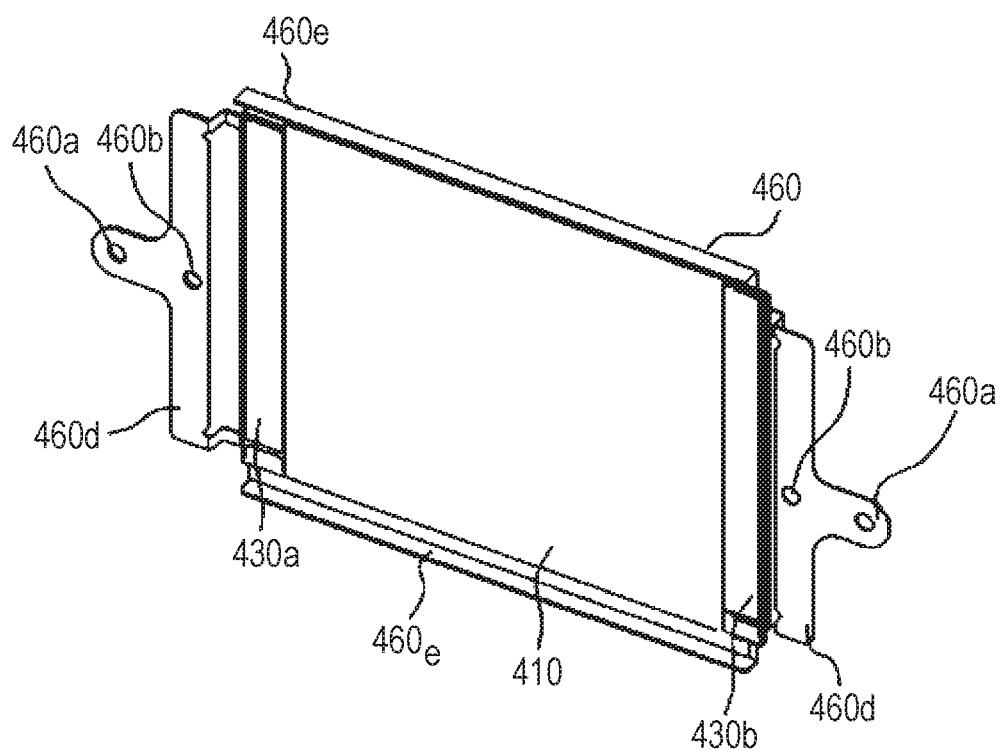
FIG. 1 is a schematic perspective view of the vibrating member of an embodiment of vibration device according to the present invention, illustrating the positional relationship of the piezoelectric elements and the vibrating plate that the vibrating member comprises.

It is known that many lead-free piezoelectric materials including BZT-BCT and $BaTiO_3$ (barium titanate) have a phase transition temperature within the operating temperature range thereof (between −30° C. and 50° C.) and hence the characteristics of such piezoelectric materials can abruptly change depending on the operating temperature thereof. Such a change in the piezoelectric characteristics results in a change in the vibration amplitude of the vibrating plate that takes place when the dust removal device is driven to operate. In other words, it has been difficult to date to make dust removal devices to show a stable performance regardless of the operating temperature.

In view of the above-identified problem, therefore, in an aspect of the present invention, there are provided a vibration device that shows an excellent dust removal performance and operates stably regardless of the operating temperature, a dust removal device equipped with such a vibration device and an imaging device having the vibrating member of such a vibration device arranged on the light receiving surface side of the image pickup device unit thereof.

Thus, in this aspect of the present invention, the present invention provides a vibration device that shows an excellent dust removal performances regardless of the ambient temperature of the vibration device when the vibration device is operated.

Now, currently preferable embodiments of the present invention will be described in greater detail hereinafter.

A vibration device according to the present invention comprises a vibrating member having at least n (n≥2) piezoelectric elements arranged on the surface of the vibrating plate thereof, each of the piezoelectric elements being formed by using a lead-free piezoelectric material and electrodes for applying a voltage to the piezoelectric material, wherein, if the temperature that maximizes the piezoelectric constant of the piezoelectric material of each of the n piezoelectric elements is $T_m$ (m being a natural number between 1 and n), at least two of $T_1$ through $T_n$ differ from each other.

Preferably, the difference between the largest value and the smallest value of $T_1$ through $T_n$ is not less than 10° C. and not more than 100° C. Preferably, the maximum value of $T_1$ through $T_n$ is not higher than 60° C. and the minimum value of $T_1$ through $T_m$ is not lower than −40° C.

Each of the n piezoelectric elements may be arranged either on the front surface side or on the rear surface side of the vibrating plate, although all of the piezoelectric elements are preferably arranged on the same side of the vibrating plate from the viewpoint of workability. The piezoelectric elements may not necessarily be arranged in parallel with each other provided that they are separated from each other.

A dust removal device according to the present invention is characterized by comprising a vibration device according to the present invention. A dust removal device according to the present invention is to be incorporated in an imaging device such as a digital single-lens reflex camera for use. An imaging device according to the present invention is characterized by having the vibrating member of a vibration device according to the present invention arranged on the light receiving surface side of the image pickup device unit thereof.

(Vibration Device)

Figure 2:
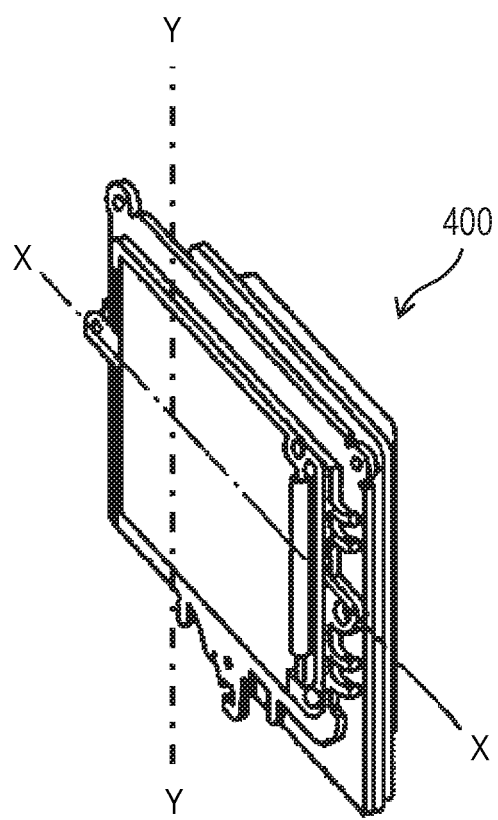
FIG. 2 is a schematic perspective view of an exemplar image pickup unit that is equipped with a vibration device for dust removal and can be used in an embodiment of imaging device according to the present invention.
Figure 4:
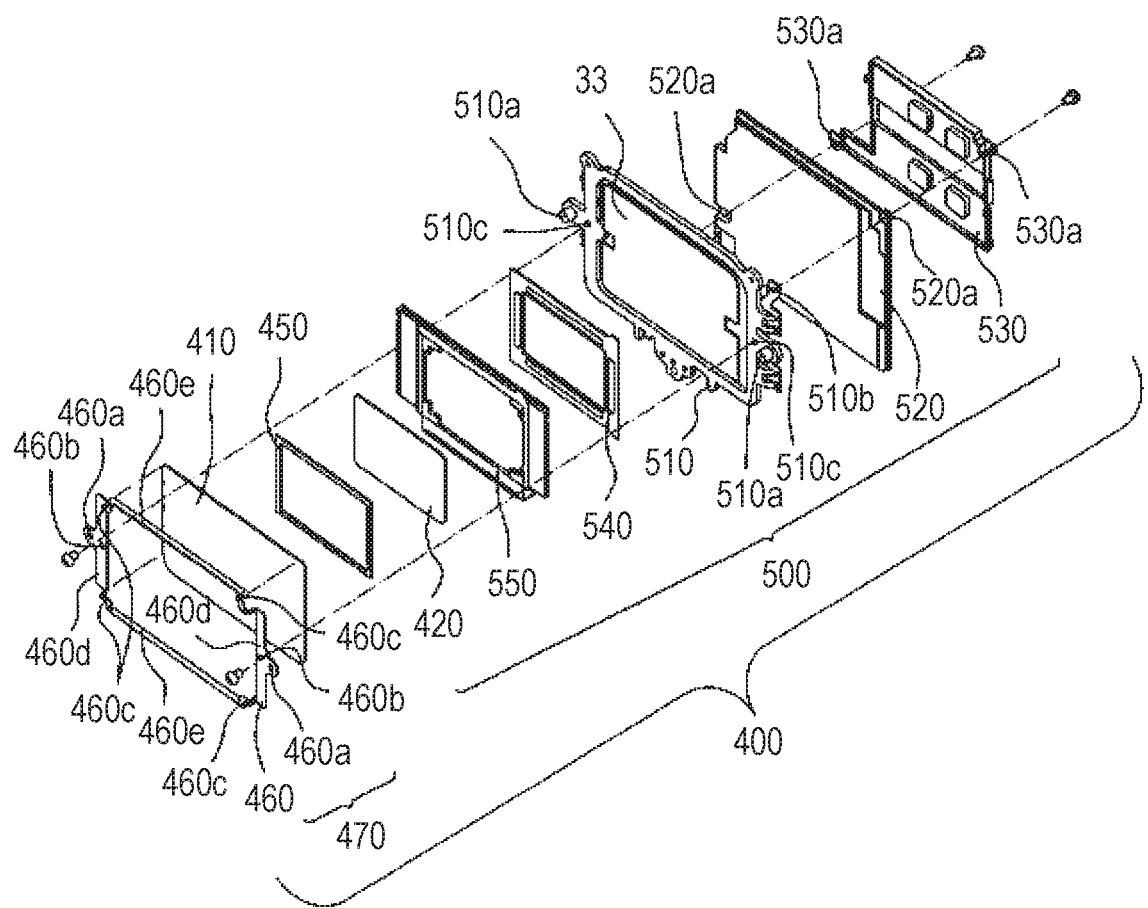
FIG. 4 is an exploded schematic perspective view of an image pickup unit equipped with a vibration device for dust removal that can be used for an embodiment of imaging device according to the present invention, illustrating the configuration thereof.

A vibration device according to the present invention comprises a vibrating member having two or more piezoelectric elements arranged on the surface of the vibrating plate thereof. FIG. 1 schematically illustrates a vibrating member having two piezoelectric elements on the surface of the vibrating plate. The two piezoelectric elements 430 (430a, 430b) are arranged on the same surface side of the rectangularly parallelepipedic vibrating plate 410 (on the front surface side in FIG. 1) respectively along the oppositely disposed short edges thereof. The vibrating plate 410 has a function of operating as an infrared cut filter and is held in position by a holding member 460 (a frame member having lateral arm parts 460d respectively running along the oppositely disposed short edges of the vibrating plate 410 and upper and lower beam parts 460e respectively running along the oppositely disposed long edges of the vibrating plate 410). As shown in FIG. 4, the vibrating plate 410 that has the piezoelectric elements 430 and is held by the holding member 460 is rigidly secured to the front surface (the subject side surface) of the image pickup device unit 500 as vibrating member (vibrating unit) 470 to form an image pickup unit 400 as shown in FIG. 2 with the image pickup device unit. Referring to FIG. 1, a positioning hole 460a and an escape hole 460b that are cut through each of the lateral arm parts of the holding member 460 are provided to rigidly attach the holding member 460 to the image pickup device unit 500.

A vibration device according to the present invention is formed by providing a vibrating member (vibrating unit) having a configuration as described above with a system (including a control circuit and a power source) for driving it so as to cause the vibrating plate to vibrate. As a voltage is applied to the piezoelectric elements 430 that are rigidly secured to the surface of the vibrating plate 410 in a direction perpendicular to the surface of the vibrating plate, the piezoelectric elements expand or contract in a direction running in parallel with the vibrating plate depending on the direction of the voltage application. As the piezoelectric elements expand, the vibrating plate, to the surface of which the piezoelectric elements are rigidly secured, is warped to make the piezoelectric element side of the vibrating plate become convex. To the contrary, as the piezoelectric elements contract, the vibrating plate, to the surface of which the piezoelectric elements are rigidly secured, is warped to make the vibrating plate side become convex. Therefore, as an alternating voltage is applied to the piezoelectric elements, the vibrating plate, to the surface of which the piezoelectric elements are rigidly secured, vibrates in opposite directions perpendicular to the surface thereof. Particularly, when an alternating voltage whose frequency is close to the natural frequency of the vibrating plate is applied, the vibrations of the vibrating plate are boosted due to the resonance effect thereof so that the vibrating plate can be made to vibrate to a large amplitude if only a low voltage is applied to the piezoelectric elements.

(Piezoelectric Element)

Each of the plurality of (n) piezoelectric elements that a vibrating member according to the present invention comprises is formed by using at least a lead-free piezoelectric material and electrodes to be used for applying a voltage to the piezoelectric material. FIGS. 3A through 3C are three views (a front side view, a right lateral side view, a rear side view from the left) that schematically illustrate the configuration of such a piezoelectric element 430. Referring to FIGS. 3A through 3C, the piezoelectric element 430 comprises a piezoelectric material 431 in an oblong plate-like form, a first electrode 432 and a second electrode 433, the first electrode 432 and the second electrode 433 being thin film-like members arranged so as to respectively cover the rear surface and the front surface of the piezoelectric material 431. The first electrode 432 that is mainly arranged on the rear surface side is partly extended to the front surface side so that, if the rear surface of the piezoelectric element 430 is bonded to the surface of a vibrating plate, a voltage can be applied to both the first electrode and the second electrode from the front surface side.

Thus, a lead-free piezoelectric material 431 is employed for each of the piezoelectric elements 430 to be used for the purpose of the present invention. As far as the present invention is concerned, the expression of a lead-free piezoelectric material means that the lead content ratio of the piezoelectric element 430 is less than 1,000 ppm. Most of the piezoelectric materials that have been employed for conventional piezoelectric elements contain lead zirconate titanate as principal ingredient. Thus, it has been pointed out that, when piezoelectric elements are scrapped and wetted by acidic rain or otherwise left in a harsh environment, for instance, the lead components contained in the piezoelectric materials can be dissolved into the soil to adversely affect the surrounding ecosystem. However, when the lead content ratio of piezoelectric elements is less than 1,000 ppm and if piezoelectric elements 430 containing lead at such a low content ratio are scrapped and wetted by acidic rain or otherwise left in a harsh environment, the lead components contained in the scrapped piezoelectric material 431 can hardly harm the surrounding environment.

Additionally and preferably, the lead-free piezoelectric material 431 to be used for the purpose of the present invention is a barium titanate-based material. A barium titanate-based material refers to a perovskite type metal oxide material that contains barium titanate ($BaTiO_3$) as principal ingredient thereof. Of various lead-free piezoelectric materials, piezoelectric materials that contain barium titanate as principal ingredient show a piezoelectric constant $d_{31}$ whose absolute value is large. Then, such a piezoelectric material requires only a low voltage to be applied to it in order to make it produce a same amount of strain.

For the purpose of the present invention, a perovskite type metal oxide material refers to a metal oxide material having a perovskite structure, which is ideally a cubic crystal structure, as defined in Iwanami Rikagaku Jiten Dictionary, 5th Edition (published by Iwanami Shoten, Feb. 20, 1998). Metal oxides having a perovskite structure are generally expressed by chemical formula $ABO_3$. In a perovskite type metal oxide, elements A and B take the respective forms of ions and also take respective specific positions in the unit cell, which positions are referred to as site A and site B. For example, if the unit cell is the unit cell of a cubic crystal, element A is located at the apex of the cube and element B is located at the center of the cube, whereas element O takes the form of a negative ion of oxygen and is located at the face center position of the cube.

A piezoelectric material 431 to be used for the purpose of the present invention contains a perovskite type metal oxide expressed by general formula (1) shown below as principal ingredient and Mn is contained in the metal oxide, the content ratio of Mn preferably being not less than 0.02 weight parts and not more than 0.40 weight parts relative to 100 weight parts of the metal oxide when reduced to metal.

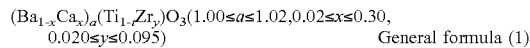
$(Ba_{1-x}Ca_x)_a(Ti_{1-y}Zr_y)O_3 (1.00 \leq a \leq 1.02, 0.02 \leq x \leq 0.30, 0.020 \leq y \leq 0.095)$   General formula (1)

A metal oxide expressed by the above-described general formula (1) means that the metal elements of Ba and Ca are located at site A and the metal elements of Ti and Zr are located at site B. Note, however, that Ba and Ca may partly be located at site B. Similarly, Ti and Zr may partly be located at site A.

In a metal oxide that is expressed by the general formula (1), the molar ratio of the elements at site B to the element O is 1:3. However, if the molar ratio is slightly altered (within the range between 1.00:2.94 and 1.00:3.06), the metal oxide can also be classified as perovskite type metal oxide provided that a perovskite structure is found in the main phase of the metal oxide. Whether a metal oxide has a perovskite structure or not can be determined by means of a structure analysis using X-ray diffraction or electron diffraction.

In the general formula (1), x that shows the molar ratio of Ca located at site A is preferably found within the range of $0.020 \leq x \leq 0.30$. The dielectric loss (tanδ) can increase when x is smaller than 0.02. As the dielectric loss increases, the amount of heat that is generated when a voltage is applied to the piezoelectric element to drive the latter also increases to in turn reduce the drive efficiency of the piezoelectric element. When, on the other hand, x is greater than 0.30, the piezoelectric characteristics of the piezoelectric element can become unsatisfactory.

In the general formula (1), y that shows the molar ratio of Zr located at site B is preferably found within the range of $0.020 \leq y \leq 0.095$. The piezoelectric characteristics of the piezoelectric element can become unsatisfactory when y is smaller than 0.020. When, on the other hand, y is greater than 0.095, the Curie temperature (Tc) can fall below 85° C. to become too low and the piezoelectric characteristics of the piezoelectric element can be degraded at high temperatures.

Additionally, in the general formula (1), a that shows the ratio of the total molar quantity of Ba and Ca located at site A to the total molar quantity of Ti and Zr located at site B is preferably found within the range of $1.00 \leq a \leq 1.02$. An abnormal grain growth is apt to take place so that the mechanical strength of the piezoelectric material 431 can fall when a is smaller than 1.00. When, on the other hand, a is greater than 1.02, the temperature that is required for grain growth becomes too high so that the grain density cannot be raised to a satisfactory level in an ordinary firing furnace and the number of pores and that of defects in the piezoelectric material 431 can become too large.

There are no particular limitations to the technique to be used to determine the composition of the piezoelectric material 431 to be used for the purpose of the present invention. Techniques that can be used to determine the composition of the piezoelectric material include fluorescent x-ray analysis, IPC emission spectroscopic analysis and atomic absorption spectrometry. The weight ratio and the composition ratio of each of the elements contained in the piezoelectric material 431 can computationally be determined by means of any of the above-listed techniques.

Preferably, the piezoelectric material 431 to be used for the purpose of the present invention contains a perovskite type metal oxide expressed by the general formula (1) as principal ingredient thereof and Mn is contained in the metal oxide, the content ratio of Mn preferably being not less than 0.02 weight parts and not more than 0.40 weight parts relative to 100 weight parts of the metal oxide when reduced to metal.

The insulating property and the mechanical quality factor Qm of the piezoelectric metal material are improved when it contains Mn within the above-identified range.

The mechanical quality factor Qm is a coefficient for indicating the elastic loss caused by vibrations when a piezoelectric element is evaluated as vibrator. The mechanical quality factor can be observed as sharpness of the resonance curve in an impedance measurement. In other words, the mechanical quality factor is a constant that indicates the sharpness of resonance of a piezoelectric element. When the mechanical quality factor Qm of a piezoelectric element shows a large value, the amount of strain of the piezoelectric element is further increased at and near the resonance frequency thereof so that the piezoelectric element 430 can effectively be driven to vibrate.

The expression of "as reduced to metal" that is employed when describing the Mn content ratio herein refers to the value obtained from the ratio of the weight of Mn relative to the total weight of Ba, Ca, Ti, Zr and Mn contained in the metal oxide expressed by the general formula (1) as expressed in terms of metal oxides of the elements, the total weight being expressed as 100, on the basis of the content ratio of each of the metals of Ba, Ca, Ti, Zr and Mn as determined by measuring them by means of X-ray fluorescent analysis (XRF), ICP optical emission spectrometry, atomic absorption spectroscopy or the like.

When the Mn content ratio is less than 0.02 weight parts, the effect of the polarization treatment necessary for driving the piezoelectric element 430 can be unsatisfactory. When, on the other hand, the Mn content ratio becomes greater than 0.40 weight parts, the piezoelectric characteristics of the piezoelectric element 430 can become unsatisfactory. Additionally, such a large Mn content ratio is not desirable because crystals having a hexagonal structure that do not do anything good for the piezoelectric characteristics can appear.

Note here that Mn preferably is held to site B as solid solution. When Mn is held to site B as solid solution and the ratio of the molar amount of Ba and Ca at site A relative to the molar amount of Ti, Zr and Mn at site B is expressed as A/B, the preferable range of A/B is $0.993 \leq A/B \leq 0.998$. When A/B is found within the above-defined range, the piezoelectric element 430 shows large stretching vibrations in the longitudinal direction of the piezoelectric element 430 and its mechanical quality factor takes a large value so that the piezoelectric element 430 by turn shows an excellent vibration performance and an excellent durability.

The piezoelectric material 431 may contain Bi by not less than 0.042 weight parts and not more than 0.850 weight parts relative to 100 weight parts of the metal oxide 100 that is expressed by the general formula (1) when reduced to metal. The Bi content ratio relative to the metal oxide can typically be measured by means of an ICP-MS composition analysis. Bi may be located at the grain boundaries of the piezoelectric material that appears like a ceramic material or alternatively exist as solid solution in the perovskite type structure of $(Ba, Ca)(Ti, Zr)O_3$. When Bi is found at the grain boundaries of the piezoelectric material, the friction among the grains is reduced to by turn increase the mechanical quality factor. When, on the other hand, Bi is taken into the solid solution that forms a perovskite structure, the phase transition temperature falls to by turn reduce the temperature dependency of the piezoelectric constant and further improve the mechanical quality factor. When the position at which Bi is taken into the solid solution is site A, the electrical charge balance between Bi and Mn at site A will advantageously be improved.

Preferably, the phase transition temperature from the first crystal phase to the second crystal phase of the piezoelectric material 431 is found at or near the operating temperature of the dust removal device and the absolute value of the piezoelectric constant $d_{31}$ of the piezoelectric material becomes maximally large at or near the phase transition temperature.

Additionally and preferably, both the first crystal phase and the second crystal phase of the piezoelectric material 431 are ferroelectric crystal phases and the piezoelectric material 431 has a phase transition temperature of moving from one of the ferroelectric crystal phase to the other ferroelectric crystal phase. The expression of ferroelectric crystal phase as used herein refers to a crystal phase that is strongly ferroelectric and belongs to one of the seven crystal systems including the triclinic system, the monoclinic system, the orthorhombic system, the hexagonal system, the trigonal system, the rhombohedral system and the tetragonal system.

(Method of Manufacturing Piezoelectric Element)

Now, a method of manufacturing a piezoelectric material 431 to be used for piezoelectric elements for the purpose of the present invention will be described below. Firstly, in order to adjust the temperature (temperature T) that maximizes the absolute value of the piezoelectric constant $d_{31}$ of the piezoelectric material, a powdery starting material is prepared by selecting the molar amounts of Ba, Ca, Ti, Zr and Mn within the above-defined respective ranges. Then, a predetermined amount of the powdery starting material having a desired composition is taken and, if necessary, a dispersant, a binder, a plasticizer and water or an organic solvent are added thereto and mixed with the powdery starting material. Thereafter, a molded piece of the mixture is prepared by means of press molding, applying pressure of the level necessary for obtaining a high-density sintered piece out of the molded piece of the mixture. If pressure of the necessary level is not obtained only by press molding, pressure to be applied of the necessary level may be obtained by means of CIP (cold isostatic press) or by some other means. Alternatively, a molded piece ingot may be prepared without using press molding and only by means of CIP or some other means from the beginning. Still alternatively, the powdery starting material may be turned into slurry and the slurry may then be applied onto a support member such as a film member to a predetermined thickness by means of a doctor blade technique or a die coating technique and dried to produce a molded piece in the form of a green sheet.

Then, the molded piece is baked to prepare a piezoelectric material 431 in the form of a sintered ceramic piece. A ceramic as used herein refers to a polycrystalline substance whose basic ingredient is a metal oxide and that is a baked and hardened agglomerate (or a bulk) of crystal particles obtained by way of a heat treatment. A ceramic may or may not be processed after the sintering.

An appropriate baking method that is optimally suited for obtaining a piezoelectric material may be selected and used under appropriate baking conditions. The prepared piezoelectric material desirably has a high density and contains grains grown to a uniform size. If necessary, the molded piece may be treated to make it show a desired shape before the baking operation.

The piezoelectric material 431 in the form of a sintered ceramic that is prepared by the above-described technique is then subjected to a grinding process to produce a substantially cubic piezoelectric material 431 showing desired dimensions. The expression of "substantially cubic" as used herein basically refers to hexahedral or having six surfaces, all of which may or may not be so many rectangles. Preferably such a cube is in the form of a plate but may have one or more chipped corners and/or one or more rounded corners. Then, a first electrode 432 and a second electrode 433 are formed on the ground piezoelectric material 431 as shown in FIGS. 3A through 3C typically by means of metal paste baking, by sputtering, by vapor deposition or by some other means.

The first electrode 432 and the second electrode 433 are electro-conductive layers having a thickness between 5 nm and 2,000 nm. There are no particular limitations to the material of the electrodes and any material that is normally employed for piezoelectric elements 430 to form electrodes may be employed for those electrodes. Examples of electrode materials that can be used for the first electrode 432 and the second electrode 433 include metals such as Ti, Pt, Ta, Ir, Sr, In, Sn, Au, Al, Fe, Cr, Ni, Pd, Ag and Cu and compounds of the above-listed metals.

The first electrode 432 and the second electrode 433 may be formed by using one of the above-listed substances or by using a laminate of two or more of the above-listed substances. Additionally, the first electrode 432 and the second electrode 433 may be formed by using respective materials that are different from each other.

The profiles of the electrodes are not limited to those illustrated in FIGS. 3A through 3C. In other words, an optimum profile may be selected for the electrodes by taking the size of the effective area of the photoelectric conversion plane of the image pickup device 33 (see FIG. 4) for which the electrodes of the piezoelectric elements are employed, the material and the dimensions of the vibrating plate 410, the positional relationship between the piezoelectric elements 430 and the image pickup device 33 and other factors into consideration.

As described above, the first electrode 432 may take a part of the surface of the piezoelectric element 430 where the second electrode 433 is arranged, which will be referred to as the second electrode surface hereinafter, so that an alternating voltage can be applied to the first and second electrodes 432 and 433 only from the side of the second electrode surface that carries the second electrode 433 and a part of the first electrode 432. To realize such an arrangement, to begin with, a first electrode 432 and another first electrode 432 are formed respectively on the first surface entirely dedicated to the first electrode 432, which will be referred to as the first electrode surface hereinafter, and on the second electrode surface such that the first electrode 432 on the second electrode surface may be electrically isolated from the second electrode 433. Then, the first electrode 432 arranged on the first electrode surface and the first electrode 432 arranged on the second electrode surface are electrically connected to each other. There are no particular limitations to the method to be used to electrically connect the first electrode 432 on the first electrode surface to the first electrode 432 on the second electrode surface. For example, the two first electrodes 432 may be connected to each other on the lateral sides of the piezoelectric material 431 typically by means of metal paste baking, sputtering or vapor deposition. Note, however, that the distance separating the first electrode 432 arranged on the second electrode surface and the second electrode 433 is preferably made as small as possible, provided that no electrode discharge takes place in the subsequent polarization treatment, which will be described in greater detail below.

Next, the piezoelectric element 430 is subjected to a polarization treatment. The polarization treatment is normally executed at a temperature not higher than the Curie temperature Tc, although the polarization treatment may alternatively be executed at room temperature. The duration of the polarization treatment is preferably between 5 minutes and 10 hours. The polarization treatment may be executed in air or in non-combustible oil such as silicone oil. For the treatment voltage, an electric field between 0.5 and 5.0 kV/mm is applied to the piezoelectric element 430. The treatment voltage may be applied only to the first electrode 432 and the second electrode 433. The polarization treatment is executed preferably before the piezoelectric element 430 is rigidly secured to the vibrating plate 410, although the polarization treatment may alternatively be executed after the piezoelectric element 430 is rigidly secured to the vibrating plate 410.

(Evaluation of Piezoelectric Characteristics)

If the temperature at which the piezoelectric constant of each of the piezoelectric materials of the n (n≥2) piezoelectric elements arranged on the vibrating plate of the vibrating member is maximized is $T_m$ (m being a natural number between 1 and n), the present invention is characterized in that at least two of $T_1$ through $T_n$ differ from each other. Desirably, the difference between the largest value and the smallest value of $T_1$ through $T_n$ is not smaller than 10° C. and not greater than 100° C. A vibration device according to the present invention stably shows a remarkable dust removing capability in the practical operating temperature range of dust removal devices when the difference is within the above-described range.

The temperature T that maximizes the piezoelectric constant of each of the piezoelectric materials is normally the phase transition temperature between two ferroelectric crystal phases that show different crystal structures and the temperature T can be adjusted by adjusting the composition of the piezoelectric material. When the piezoelectric material is a barium titanate-based material, the temperature T can easily be controlled by mainly controlling the calcium content ratio (Ca content ratio). If the Ca content ratio of the piezoelectric material having the highest temperature T that maximizes the piezoelectric constant is $C_H$ and the Ca content ratio of the piezoelectric material having the lowest temperature T that maximizes the piezoelectric constant is $C_L$, $C_H$ and $C_L$ generally show a relationship of $C_H < C_L$.

Figure 8:
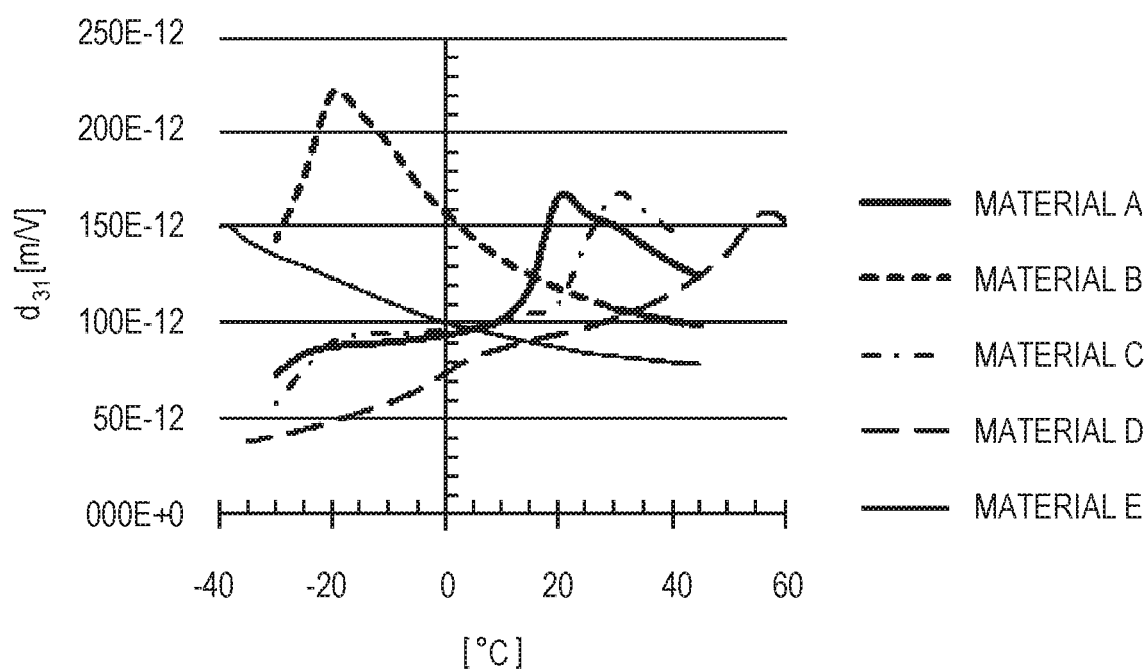
FIG. 8 is a graph illustrating the relationship between the piezoelectric constants of the piezoelectric materials to be used for the piezoelectric elements of an embodiment of vibration device according to the present invention and the operating temperatures of the piezoelectric elements.

The piezoelectric constant $d_{31}$ of each of the samples obtained by dicing piezoelectric materials for forming piezoelectric elements 430, or piezoelectric elements 430, prepared according to the present invention, was measured between 85° C. and −40° C. according to the standard of Japan Electronics and Information Technology Industries Association (JEITA EMBLEM-4501), gradually lowering the temperature from 85° C. down to −40° C. FIG. 8 shows the results of the measurements. Note that the piezoelectric constant $d_{31}$ was determined by measuring the resonance frequency and the antiresonance frequency by means of a commercially available impedance analyzer and then computing the piezoelectric constant $d_{31}$, using the resonance-antiresonance method.

When determining the temperature T for each of the piezoelectric materials, the phase transition temperature (the phase transition temperature observed when lowering the temperature) from the first ferroelectric crystal phase (high temperature side) to the second ferroelectric crystal phase (low temperature side) and the phase transition temperature (the phase transition temperature observed when raising the temperature) from the second ferroelectric crystal phase to the first ferroelectric crystal phase show a slight temperature difference. For the purpose of the present invention, the phase transition temperature T was determined by observing the piezoelectric constant $d_{31}$ at the time of phase transition from the first ferroelectric crystal phase to the second ferroelectric crystal phase (observed when lowering the temperature).

Note that the temperature T that maximizes the piezoelectric constant of the piezoelectric material 431 is equal to the temperature that maximizes the dielectric constant of the piezoelectric material. Therefore, the temperature that maximizes the dielectric constant that is obtained by observing the dielectric constant that varies as a function of temperature may be used as the temperature T, instead of measuring the piezoelectric constant $d_{31}$. Additionally, since the largest value of the dielectric constant of the piezoelectric material is equal to the largest value of the electrostatic capacity of the piezoelectric element formed by using the piezoelectric material, the electrostatic capacity of the piezoelectric element 430 may be observed, while changing the temperature thereof, and the temperature that maximizes the electrostatic capacity may be used as the temperature T.

For the purpose of the present invention, the temperature T is preferably within the range between −40° C. and 85° C., more preferably within the range between −40° C. and 60° C.

Additionally, since the value of the piezoelectric constant of a piezoelectric material gradually falls as the temperature thereof is moved away from the temperature that maximizes the piezoelectric constant, the temperature T is preferably so adjusted that it is found between 50° C. (±10° C.) and −30° C. (±10° C.) because the vibration device is operated mainly within the above-defined temperature range. In other words, preferably, the largest value of $T_1$ through $T_n$ is not higher than 60° C. and the smallest value of $T_1$ through $T_n$ is not lower than −40° C.

(Configuration of Imaging Device equipped with Vibration Device for Dust Removal)

FIG. 2 is a schematic perspective view of an image pickup unit 400 equipped with a vibration device for dust removal and mounted in a digital single-lens reflex camera. In FIG. 2, line X-X passes through the center part of the image pickup device 33 and indicates the transversal direction of the camera, whereas line Y-Y also passes through the center part of the image pickup device 33 and indicates the vertical direction of the camera.

FIG. 4 is an exploded schematic perspective view of the image pickup unit 400 of FIG. 2, illustrating the configuration thereof. The image pickup unit 400 roughly comprises a vibration unit (vibration device) 470, an elastic member 450 and an image pickup device unit 500. As will be described in greater detail hereinafter, the vibration unit 470 is rigidly secured to the image pickup device unit 500 in such a manner that they pinch the elastic member 450 from the opposite sides and, more specifically, the elastic member 450 is pinched between the vibrating plate 410 (which also operates as IR cut filter) of the vibration unit 470 and the image pickup device unit 500.

The image pickup device unit 500 includes the image pickup device 33 and an image pickup device holding member 510 for holding the image pickup device 33 and additionally comprises a circuit board 520, a shield case 530, a light shielding member 540, an optical low pass filter holding member 550 and an optical low pass filter 420.

The image pickup device holding member 510 is typically made of metal and provided with positioning pins 510a, threaded holes 510b and threaded holes 510c. The electric circuit of the imaging system of the imaging device is mounted on the circuit board 520 and provided with escape holes 520a for receiving screws. The shield case 530 is typically made of metal and provided with escape holes 530a for receiving screws. The circuit board 520 and the shield case 530 are anchored to the image pickup device holding member 510 by means of the escape holes 520a for receiving screws, the escape holes 530a for receiving screws and the screw holes 510b and the shield case 530 is electrically connected to the ground potential level on the circuit in order to protect the electric circuit against static electricity and other harmful factors.

The light shielding member 540 has an opening that corresponds to the effective area of the photoelectric conversion plane of the image pickup device 33 and is provided with an adhesion layer both on the subject side and on the photographer side. The optical low pass filter holding member 550 is rigidly secured to the cover glass 33a of the image pickup device 33 by way of the corresponding one of the adhesion layers arranged on the light shielding member 540. The optical low pass filter 420 is positioned at the opening of the optical low pass filter holding member 550 and rigidly secured to the light shielding member 540 by way of the corresponding one of the adhesion layers.

Figure 5:
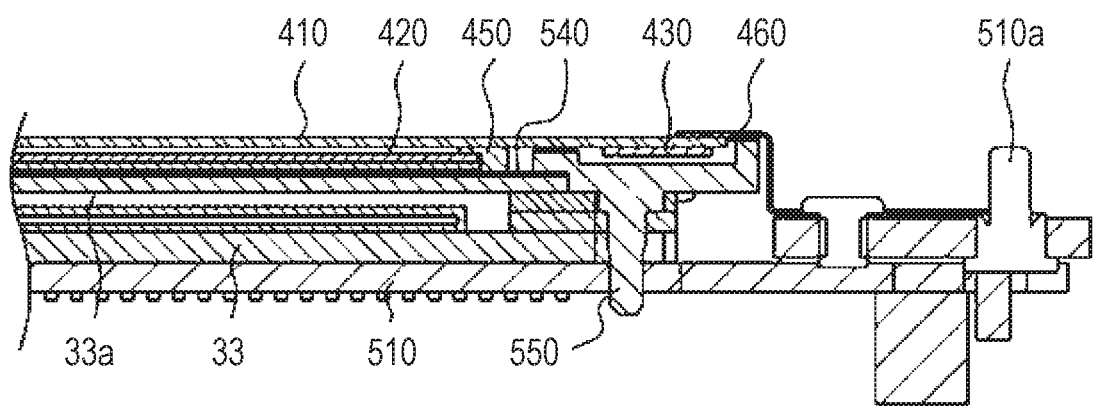
FIG. 5 is a partial cross sectional view of the image pickup unit of FIG. 2 taken along line X-X in FIG. 2.

FIG. 5 is a partial cross sectional view of the image pickup unit 400 taken along line X-X (see FIG. 2). The subject side surface of the light shielding member 540 is held in contact with the optical low pass filter 420 and the photographer side surface of the light shielding member 540 is held in contact with the cover glass 33a of the image pickup device 33. The light shielding member 540 is also provided with an adhesion layer both on the subject side and on the photographer side and the optical low pass filter 420 is securely fitted to and held by the cover glass 33a of the imaging device 33 by means of the corresponding one of the adhesion layers of the light shielding member 540. Thus, as a result, the space between the optical low pass filter 420 and the cover glass 33a of the image pickup device 33 is sealed by the light shielding member 540.

More specifically, one of the surfaces of the elastic member 450 is held in contact with the vibrating plate 410, while the other surface is held in contact with the optical low pass filter 420. Since the vibrating plate 410 is urged toward the side of the image pickup device unit 500 by the resilience of the holding member 460, the elastic member 450 and the vibrating plate 410 are held in tight contact with each other without any gap left between them, while the elastic member 450 and the optical low pass filter 420 are also held in tight contact with each other without any gap left between them. Then, as a result, the space between the vibrating plate 410 and the optical low pass filter 420 is sealed by the elastic member 450 to produce a hermetically sealed space that does not allow any foreign objects such as dusts to enter there.

The holding member 460 is made of an elastic material such as metal and provided as a single component. It has holding sections 460c located at the respective four corners (see FIG. 4) of the holding member 460, a pair of lateral arm sections 460d and upper and lower beam sections 460e, the lateral arm sections 460d and the beam sections 460e linking the holding sections 460c. Each of the arm sections 460d is a vertically extending narrow plate-like piece located at a position recessed (toward the side of the image pickup device unit 500) from the front surfaces of the corresponding ones of the holding sections 460c. Each of the arm sections 460d is integrally coupled to the corresponding upper and lower holding sections 460c respectively at the upper and lower ends thereof so as to generate urging force for urging the vibrating plate 410 toward the side of the image pickup device unit 500 and provided with a positioning hole 460a and an escape hole 460b for receiving a screw. The holding sections 460c are rigidly fitted to the vibrating plate 410 by means of an electro-conductive adhesive agent or the like at or near the respective four corners that include vibration nodes.

The piezoelectric elements 430 are rigidly secured to the vibrating plate 410. It is not necessary to make the piezoelectric elements 430 to be held in direct contact with the vibrating plate 410. In other words, the piezoelectric elements 430 may be fitted to the vibrating plate 410 by way of a resin material, an insulating material or a metal material typically in the form of an adhesive agent. Note, however, that the thickness of the applied adhesive agent is preferably not greater than 100 μm and more preferably not greater than 10 μm, because the extending and contracting motions of the piezoelectric elements 430 can hardly be transmitted to the vibrating plate 410 when the thickness of the adhesive agent is greater than 100 μm.

The piezoelectric elements 430 may rigidly be fitted to any positions on the surface of the vibrating plate 410 provided that they do not intercept light entering the image pickup device 33. Although not shown, the number of piezoelectric elements 430 to be fitted to the vibrating plate 410 is not limited to two and a pair of piezoelectric elements 430 may rigidly be fitted to each of the lateral ends of the vibrating plate 410 or a pair of piezoelectric elements 430 may additionally rigidly be fitted respectively to the upper and lower ends of the vibrating plate 410. However, the number of piezoelectric elements 430 is preferably not greater than five, because it becomes difficult to control main vibrations when six or more piezoelectric elements 430 are arranged.

Then, the vibrating plate 410 is placed at its proper position as the positioning pins 510*a* of the image pickup device unit 500 are respectively driven into the corresponding positioning holes 460*a* of the holding member 460. Thereafter, the vibration unit 470 is rigidly secured to the image pickup device unit 500 by driving screws respectively into the screw-receiving escape holes 460*b* and the threaded holes 510*c* so as to pinch the elastic member 450 between the holding member 460 and the image pickup device unit 500 while the vibrating plate 410 is held to its proper position. The vibrating plate 410 may be coated so as to make it electro-conductive. When the vibrating plate 410 is coated in such a manner, the electric charge, if any, existing on the surface of the vibrating plate 410 can be moved to the circuit board 520 by way of the holding member 460, the image pickup device holding member 510 and the shield case 530 to prevent any foreign objects from electrostatically adhering to the surface of the vibrating plate 410.

The elastic member 450 is made of a soft material such as rubber so that it can take a role of operating as vibration absorbing part of the vibrating plate 410 and produce a hermetically sealed space between the vibrating plate 410 and the optical low pass filter 420 as will be described in greater detail hereinafter. Note that, in view of enhancing vibration absorption performance of the vibrating plate 410, the elastic member 450 is formed desirably by using a thick piece or a lowly hard piece and made to contact the vibration nodes of the vibrating plate 410.

Figure 6:
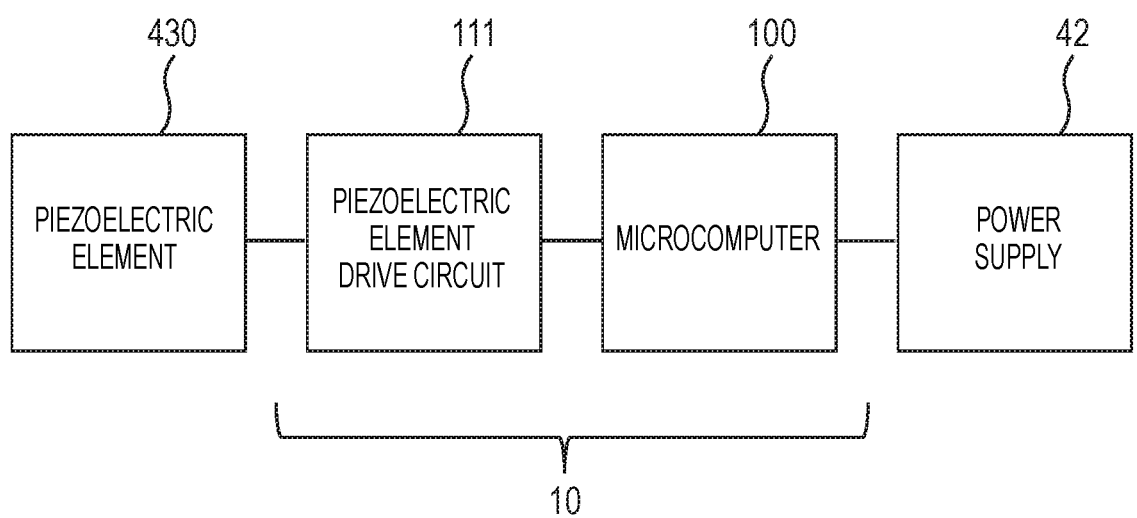
FIG. 6 is a schematic illustration of an exemplar electrical arrangement for driving the piezoelectric elements of an embodiment of vibration device according to the present invention.

Now, the method of driving the piezoelectric elements 430 for the purpose of removing the dusts adhering to the surface of the vibrating plate 410 will be described below. FIG. 6 is a schematic illustration of an exemplar electrical connection between the power source 42 for applying an alternating voltage to the piezoelectric elements and the control circuit 10 for changing the frequency of the alternating voltage. The control circuit 10 comprises a piezoelectric element drive circuit 111 for vibrating the piezoelectric elements 430 rigidly fitted to the vibrating plate 410 and a microcomputer 100 that issues instructions for the driving voltage to be applied to the piezoelectric elements 430 so as to make the vibration amplitude of the vibrating plate 410 show a predetermined value.

As an alternating voltage showing a predetermined frequency is applied to the piezoelectric elements 430 that are rigidly fitted to the vibrating plate 410 by the piezoelectric element drive circuit 111 under the control of the microcomputer 100, the piezoelectric elements 430 are extended and contracted in a direction orthogonal to the optical axis of incident light (and hence parallel to the plane of the vibrating plate 410) to make the vibrating plate 410 give rise to flexural vibrations.

The piezoelectric elements 430 are electrically connected to the piezoelectric element drive circuit 111 (FIG. 6) by way of feed wires (not shown). Commercially available flexible cables can be employed for the feed wires. While the feed wires can be made to adhere to the piezoelectric elements 430 and the drive circuit 111 by means of an epoxy-based adhesive agent, a technique of thermally crimping anisotropic conductive paste (ACP) or anisotropic conductive film (ACF) is preferably employed for the connection particularly from the viewpoint of mass production because the use of such a technique can minimize conduction failures and improve the processing rate.

A large amplitude can be obtained with a low voltage when a frequency that is close to the resonance frequency of the natural vibration mode of the vibrating plate 410 is selected for the frequency of the alternative voltage to be applied to the piezoelectric elements 430. The resonance frequency of the vibrating plate 410 varies as a function of the dimensional variability and/or the temperature of the vibrating plate 410 and the piezoelectric elements 430. Therefore, the alternating voltage should not show a constant value. In other words, it should be variable within a considerably wide range. More specifically, the application of the alternating voltage needs to be started with a frequency (the first frequency) considerably separated from the resonance frequency of the vibrating plate 410 toward the high frequency side or the low frequency side and then gradually shifted toward the resonance frequency that produces main vibrations stepwise with a step width obtained by dividing a predetermined frequency band by a predetermined number of steps for a sweeping drive. Then, the voltage application is terminated at the frequency (the second frequency) separated from the resonance frequency in the opposite direction by the amount by which the first frequency is separated from the resonance frequency that produces main vibrations of the vibrating plate 410.

It is sufficient that at least a resonance frequency that produces main vibrations of the vibrating plate 410 is found between the first frequency and the second frequency. The use of a smaller step width is preferable because the frequency of the alternating voltage can reliably be made to agree with the resonance frequency when a small step width is introduced. The step width of not more than 100 Hz is more preferable. Additionally, the step width may not necessarily be held to a constant value. In other words, the step width may be made to vary during the sweeping drive operation from the first frequency to the second frequency.

When the sweeping drive operation of sweeping the frequency of the alternating voltage is started from a low frequency, there can arise instances where the vibrating plate 410 is poorly responsive and the vibration amplitude of the vibrating plate 410 is small during the sweeping drive operation that is headed for the resonance frequency under the influence of peripheral components such as the holding member 460 and the elastic member 450. For this reason, the sweeping drive operation is preferably started from the high frequency side and directed toward the low frequency side. In other words, the first frequency is preferably higher than the second frequency.

Drive signals that differ from each other in terms of voltage and frequency may be applied to the respective piezoelectric elements 430 or, alternatively, an identical drive signal may simultaneously be applied to the piezoelectric elements 430.

The application of an alternative voltage to the piezoelectric elements 430 for the purpose of a dust removal operation is preferably so conducted as to complete a drive cycle of gradually changing the frequency from the first frequency toward the second frequency within an arbitrarily selected duration of time and, after getting to the second frequency, repeat the drive cycle of gradually changing the frequency from the first frequency down to the second frequency. A duration of time (a pause) during which a potential of 0 V is applied to the piezoelectric elements 430 may be provided between the time when the sweeping drive operation reaches the second frequency to the time when the sweeping drive operation gets back to the first frequency. It is sufficient for the sweeping drive cycle to be repeated twice to achieve the intended effect of the dust removal operation, although an excellent dust removal effect can be achieved when the sweeping drive cycle is repeated for a number of times. On the other hand, however, as the number of repetitions of the sweeping drive cycle increases, the entire duration of the dust removal operation increases. Therefore, the number of repetitions of the sweeping drive cycle may appropriately be selected by seeing the specifications of the imaging device where the vibration device for dust removal is mounted.

As far as the present invention is concerned, the operation mode in which a series of processing operations are conducted in the inside of a digital single-lens reflex camera for the above-described purpose of removing dusts is referred to as a dust removal mode. The vibrating plate 410 gets into a dust removal mode when it is directed to do so by the microcomputer 100 of the digital single-lens reflex camera. The operations in a dust removal mode will be most effective when they are automatically executed immediately after the photographer turns on the power source of the digital single-lens reflex camera and the system becomes ready to start its operation and/or immediately before the power source is turned off to shut down the system from the viewpoint of dust removal, although it may be so arranged that the digital single-lens reflex camera gets into a dust removal mode at the timing intended and indicated by the photographer.

As the microcomputer 100 receives a dust removal mode starting signal, it then transmits a drive signal to the drive circuit of the piezoelectric elements 430. Then, the piezoelectric element drive circuit 111 generates an alternating voltage for producing flexural vibrations at the vibrating plate 410 and applies the alternating voltage to the piezoelectric elements 430 by way of feed wires. The waveform of the alternating voltage may be that of a square wave, that of a sine wave, that of a triangular wave, that of a sawtooth wave or some other waveform.

Figure 7A:
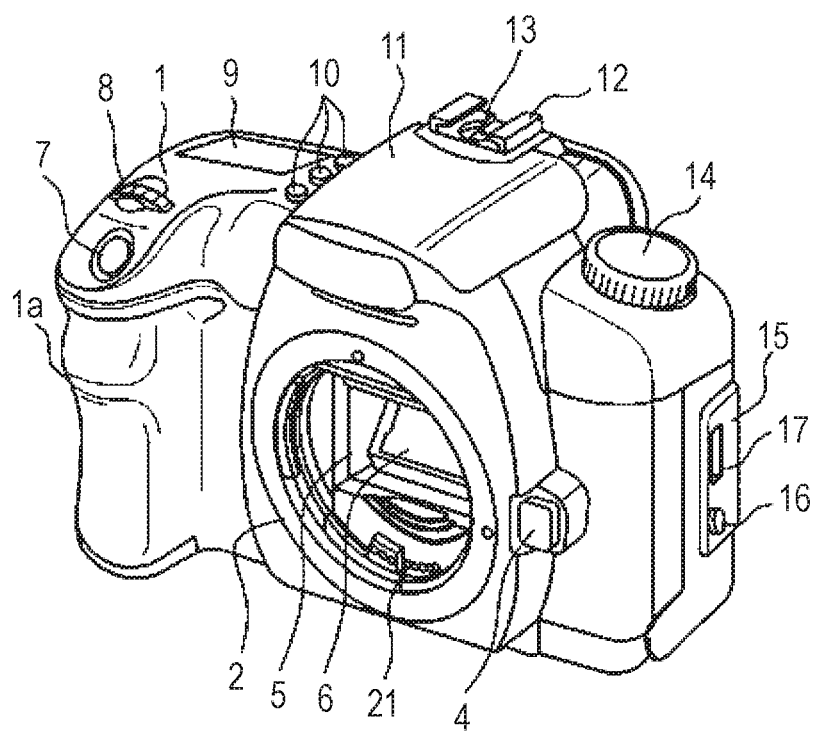
FIGS. 7A and 7B are a schematic illustration of an exemplar embodiment of imaging device according to the present invention, which is a digital single-lens reflex camera.
Figure 7B:
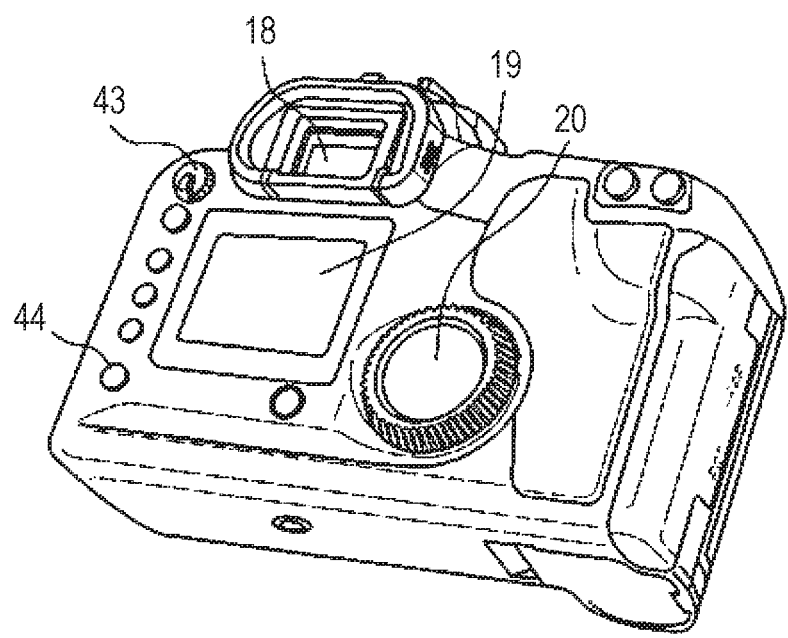

FIGS. 7A and 7B are external views of a digital single-lens reflex camera, which is an exemplar imaging device according to the present invention. FIG. 7A is a front side view (subject side view) of the camera in a state where the taking lens unit of the camera is moved away. FIG. 7B is a rear view (photographer side view) of the camera.

As shown in FIG. 7A, the camera main body 1 is provided with a grip 1a projecting toward the subject side so that the photographer can reliably and stably shoot the subject by grasping the grip with one of his or her hands. A taking lens unit (not shown) is removably but rigidly fitted to the mount 2 of the camera main body 1. Mount contact 21 allows a control signal, a state signal, a data signal and some other signal to be exchanged between the camera main body 1 and the taking lens unit and also allows electric power to be transmitted from the camera main body 1 to the taking lens unit. The mount contact 21 may be made to operate not only for electrical communications but also for optical communications and audio communications. A lens release button 4 is arranged beside the mount section 2. The taking lens unit can be taken out by pushing the lens release button 4.

A mirror box 5 is arranged in the camera main body 1 and the imaging light flux that has passed through the taking lens is guided to the mirror box 5. A main mirror (quick return mirror) 6 is arranged in the mirror box 5. The main mirror 6 can be put either into a state where it is inclined by 45° relative to the optical axis of the imaging light flux for the purpose of guiding the imaging light flux to a pentamirror (not shown) or into a state where it is retreated from the imaging light flux for the purpose of guiding the imaging light flux toward the image pickup device 33 (FIG. 5). A lid for protecting an external terminal 15 is arranged at the lateral side of the camera opposite to the side where the grip 1a is openably/closably arranged. When the lid 15 is opened, a jack 16 for outputting video signals and a connector 17 that operates as output terminal of a USB, both of which are arranged as so many external interface, become exposed.

An imaging device to be used for a digital single-lens reflex camera is described above as an example of imaging device that is equipped with a vibration device for dust removal according to the present invention. Note, however, applications of a vibration device for dust removal are not limited to digital single-lens reflex cameras and include other imaging devices and image reading devices such as digital video cameras, copying machines, fax machines and scanners as well as internal members and parts of such devices.

EXAMPLES

Now, a vibration device for dust removal according to the present invention will be described in greater detail by way of examples where a plurality of piezoelectric elements are arranged on a same surface of a vibrating plate at positions separated from each other. While a control circuit (not shown) and a power source (not shown) are fitted to the image pickup unit 400 as shown in FIG. 2 in all the examples and the comparative examples that are described below, the scope of the present invention is by no means limited by the examples that are described below.

The degree of the ability of removing the dusts adhering to the subject side surface of the vibrating plate 410 of a vibration device for dust removal by means of vibrations is referred to as the dust removal rate of the vibration device. While the dusts adhering to digital single-lens reflex cameras may have many different sizes and include dusts of many different types, the dust removal rate was measured in each of the examples and the comparative examples by using typical particles in a manner as described below.

The dust removal rate was measured in a state where the control circuit 10 and the power source 42 are connected to the image pickup unit 400. Approximately 1,000 polystyrene beads (having particle size between 20 and 80 µm) were sprayed on the entire surface of the vibrating plate 410 that is placed horizontally and left there for 1 minute. Then, the vibrating plate 410 was made to stand erect to make their flat surfaces vertical. The polystyrene beads on the surface of the vibrating plate 410 held in this state were shot by a camera by way of an optical microscope to see how they are adhering to the surface. The taken photograph was recorded as photograph P.

Then, an alternating voltage of 50 Vpp square wave that sweeps from 190 kHz to 90 kHz in a second was repeatedly applied to the piezoelectric elements 430 by way of a flexible cable for four times. Thereafter, the polystyrene beads on the surface of the vibrating plate 410 were shot by a camera by way of an optical microscope to see how they are adhering to the surface and the photograph was recorded as photograph Q exactly as in the instance of recording the photograph P.

Then, the number of polystyrene beads on the photograph P that block rays of light entering the imaging device and the number of polystyrene beads on the photograph Q that also block rays of light entering the imaging device were counted. They were respectively denoted as beads number P' and bead number Q' and the dust removal rate (unit: %) was defined as [(beads number P'—beads number Q')/beads number P']×100. When the dust removal rate is not less than 95% as determined by the above-described evaluation method of the present invention, high quality pictures that are free from picked up dust images can be obtained by means of a digital single-lens reflex camera provided with a vibration device for dust removal according to the present invention so long as the camera is operated in an ordinary manner.

In each of the examples and the comparative examples that will be described hereinafter, the dust removal rate was observed in three different sets of environmental conditions of temperature of 50° C. and relative humidity of 90%, temperature of 23° C. and relative humidity of 50% and temperature of −20° C. and relative humidity of not higher than 10%.

Example 1

Now, the technique used for preparing one of the piezoelectric elements 430 of Example 1 will be described below. Barium titanate showing an average particle size of 100 nm (BT-01: trade name, available from Sakai Chemical Industry), calcium titanate showing an average particle size of 300 nm (CT-03: trade name, available from Sakai Chemical Industry) and calcium zirconate (CZ-03: trade name, available from Sakai Chemical Industry) were weighed to make them show a molar ratio of 92.0:2.0:6.0 and employed as starting materials.

Then, the weighed powdery compounds are mixed well by dry mixing for 24 hours by means of a ball mill. Thereafter, for the purpose of granulating the powdery mixture, manganese acetate (I I) and a PVA binder were separately sprayed onto the powdery mixture by means of a spray dryer so as to make them adhere to the particle surfaces of the powdery mixture in such a way that the weight of Mn took 0.12 weight parts relative to the powdery mixture in terms of metal Mn and the weight of the PVA binder took 3 weight parts relative to the powdery mixture.

Then, the obtained granules were filled in a metal mold and a molded piece of 3.3 g/cm$^3$ was prepared by applying molding pressure of maximally 200 MPa by means of a press molding machine. The molded piece may or may not be additionally pressed by means of a cold isostatic press machine.

The molded piece was then baked in such a manner that it was heated in an air atmosphere at a temperature raising rate of 1.0° C./min and held to 600° C. for 3 hours and subsequently to 1,380° C. for 5 hours. With this arrangement, a piezoelectric material 431 whose composition can be expressed by the chemical formula (1) was prepared.

The piezoelectric material 431 was subjected to a fluorescent X-ray analysis to find that it contained Mn by 0.12 weight parts as reduced to metal relative to 100 weight parts of $(Ba_{0.92}Ca_{0.08})_{1.00}(Ti_{0.94}Zr_{0.06})O_3$. If one or more elements other than Ba, Ca, Ti, Zr and Mn were contained in the piezoelectric material, their content ratios were not above the detectable limit value and hence not greater than 1 weight part. If the piezoelectric material contained Pb, its content ratio was also not above the detectable limit value either and hence it was less than 50 ppm.

Then, the baked piece of the piezoelectric material 431 was ground and polished to make it show a uniform thickness of 0.25 mm. Thereafter, it was cut to make it show dimensions of 26.0×4.0 mm. Subsequently, a first electrode 432 and a second electrode 433 were formed on the oppositely disposed surfaces of the piezoelectric material 431 as shown in FIGS. 3A through 3C by means of screen printing, using silver paste.

Thereafter, the temperature Tc that maximized the dielectric constant was measured by gradually raising the temperature of the prepared piezoelectric element 430 in a thermostatic chamber and observing the change in the dielectric constant. As a result, Tc was found to be equal to 110° C. Additionally, the piezoelectric element 430 was subjected to a polarization treatment by applying a voltage to the second electrode 433 from a DC power source for 10 minutes so as to produce an electric field intensity of 1 kV/mm, while heating the piezoelectric element 430 to 100° C. on a hot plate to produce a finished piezoelectric element 430. The curve of material A in the graph of FIG. 8 shows the temperature dependency of the piezoelectric constant $d_{31}$ of the piezoelectric material of this example and the temperature $T_1$ that maximized the piezoelectric constant $d_{31}$ was 20° C.

Now, the technique used for preparing the other piezoelectric element 430 will be described below. Barium titanate showing an average particle size of 100 nm (BT-01: trade name, available from Sakai Chemical Industry), calcium titanate showing an average particle size of 300 nm (CT-03: trade name, available from Sakai Chemical Industry) and calcium zirconate showing an average particle size of 300 nm (CZ-03: trade name, available from Sakai Chemical Industry) were weighed to make them show a molar ratio of 86.0:8.0:6.0 and employed as starting materials.

Then, the weighed powdery compounds are mixed well by dry mixing for 24 hours by means of a ball mill. Thereafter, for the purpose of granulating the powdery mixture, manganese acetate (I I) and a PVA binder were separately sprayed onto the powdery mixture by means of a spray dryer so as to make them adhere to the particle surfaces of the powdery mixture in such a way that the weight of Mn took 0.14 weight parts relative to the powdery mixture in terms of metal Mn and the weight of the PVA binder took 3 weight parts relative to the powdery mixture.

Thereafter, the process used for the above-described first technique was also employed for this technique to prepare the other piezoelectric element 430. The piezoelectric material 431 was subjected to a fluorescent X-ray analysis to find that it contained Mn by 0.14 weight parts in terms of metal relative to 100 weight parts of $(Ba_{0.86}Ca_{0.14})_{1.00}(Ti_{0.94}Zr_{0.06})O_3$. If one or more elements other than Ba, Ca, Ti, Zr and Mn were contained in the piezoelectric material, their content ratios were not above the detectable limit value and hence not greater than 1 weight part. If the piezoelectric material contained Pb, its quantity was also not above the detectable limit value either and hence it was less than 50 ppm. The curve of material B in the graph of FIG. 8 shows the temperature dependency of the piezoelectric constant $d_{31}$ of this piezoelectric material and the temperature $T_2$ that maximized the piezoelectric constant $d_{31}$ was −20° C.

The temperature $T_1$ and the temperature $T_2$ of the two piezoelectric elements were compared with each other and the higher one was expressed as Tmax, while the lower one was expressed as Tmin. Since the higher temperature T (Tmax) was 20° C. and the lower temperature T (Tmin) was −20° C., the difference (ΔT) between them was 40° C. $C_H$ was 4.0 mol % relative to all the metals contained in the piezoelectric material and $C_L$ was 7.0 mol % relative to all the metals contained in the piezoelectric material. In other words, $C_H<C_L$ held true.

Then, feed wires, which were flexible cables, to be used for applying an alternating voltage were connected to the prepared piezoelectric elements 430 by means of ACF. The thermal crimping device for connecting the ACF was operated under the conditions of temperature of 150° C., duration of 10 seconds and pressure of 2 MPa.

Thereafter, the first electrode surfaces of the piezoelectric elements 430 were bonded to the vibrating plate 410 by means of an epoxy resin-based adhesive agent to produce a finished vibration device for dust removal. The vibrating plate 410 was a transparent cubic birefringent plate of rock crystal having dimensions of 28.0×38.0×0.55 mm.

An image pickup unit (imaging device) 400 according to the present invention was prepared by using the above-described vibration device for dust removal and the dust removal rate thereof was evaluated to find that it was 99% at 50° C. (relative humidity 90%), 99% at 23° C. (relative to humidity 50%) and 99% at −20° C. (relative humidity not higher than 10%). In other words, it showed an excellent dust removal rate of not lower than 95% in the temperature range between −20° C. and 50° C.

Example 2

A piezoelectric material 431 (material C in FIG. 8) whose temperature $T_1$ that maximized its piezoelectric constant was 30° C. was prepared by adjusting the mixing ratio of barium titanate, calcium titanate and calcium zirconate and the weight parts of Mn contained in the PVA binder as described above for Example 1.

The piezoelectric material 431 was subjected to a fluorescent X-ray analysis to find that it contained Mn by 0.12 weight parts as reduced to metal relative to 100 weight parts of $(Ba_{0.93}Ca_{0.07})_{1.00}(Ti_{0.94}Zr_{0.06})O_3$. If one or more elements other than Ba, Ca, Ti, Zr and Mn were contained in the piezoelectric material, their content ratios were not above the detectable limit value and hence not greater than 1 weight part. If the piezoelectric material contained Pb, its quantity was also not above the detectable limit value either and hence it was less than 50 ppm.

As another piezoelectric material, a piezoelectric material (material A in FIG. 8) whose temperature $T_2$ that maximized its piezoelectric constant was 20° C. was prepared as in Example 1.

The temperature $T_1$ and the temperature $T_2$ of the two piezoelectric materials were compared with each other and the higher one was expressed as Tmax, while the lower one was expressed as Tmin. Since the higher temperature T (Tmax) was 30° C. and the lower temperature T (Tmin) was 20° C., the difference (ΔT) between them was 10° C. $C_H$ was 3.5 mol % relative to all the metals contained in the piezoelectric material and $C_L$ was 4.0 mol % relative to all the metals contained in the piezoelectric material. In other words, $C_H<C_L$ held true.

As in Example 1, a pair of piezoelectric elements was prepared by using the piezoelectric materials and then a vibration device for dust removal was prepared by using the piezoelectric elements. Thereafter, an image pickup unit was prepared by using the vibration device and driven to operate to evaluate the dust removal rate as in Example 1. As a result, the dust removal rate was 99% at 50° C. (relative humidity 90%), 99% at 23° C. (relative humidity 50%) and 96% at −20° C. (relative humidity not higher than 10%). In other words, it showed an excellent dust removal rate of not lower than 95% in the temperature range between −20° C. and 50° C.

Example 3

A piezoelectric material 431 (material D in FIG. 8) whose temperature $T_1$ that maximized its piezoelectric constant was 60° C. was prepared by adjusting the mixing ratio of barium titanate, calcium titanate and calcium zirconate and the weight parts of Mn contained in the PVA binder in a manner as described above for Example 1.

The piezoelectric material 431 was subjected to a fluorescent X-ray analysis to find that it contained Mn by 0.10 weight parts as reduced to metal relative to 100 weight parts of $(Ba_{0.96}Ca_{0.04})_{1.00}(Ti_{0.94}Zr_{0.06})O_3$. If one or more elements other than Ba, Ca, Ti, Zr and Mn were contained in the piezoelectric material, their content ratios were not above the detectable limit value and hence not greater than 1 weight part. If the piezoelectric material contained Pb, its content ratio was also not above the detectable limit value either and hence it was less than 50 ppm.

As the other piezoelectric material, a piezoelectric material 431 (material E in FIG. 8) whose temperature $T_2$ that maximized its piezoelectric constant was −40° C. was prepared The piezoelectric material 431 was subjected to a fluorescent X-ray analysis to find that it contained Mn by 0.24 weight parts as reduced to metal relative to 100 weight parts of $(Ba_{0.813}Ca_{0.187})_{1.00}(Ti_{0.94}Zr_{0.06})O_3$. If one or more elements other than Ba, Ca, Ti, Zr and Mn were contained in the piezoelectric material, their content ratios were not above the detectable limit value and hence not greater than 1 weight part. If the piezoelectric material contained Pb, its content ratio was also not above the detectable limit value either and hence it was less than 50 ppm.

The temperature $T_1$ and the temperature $T_2$ of the two piezoelectric materials were compared with each other and the higher one was expressed as Tmax, while the lower one was expressed as Tmin. Since the higher temperature T (Tmax) was 60° C. and the lower temperature T (Tmin) was −40° C., the difference (ΔT) between them was 100° C. $C_H$ was 2.0 mol % relative to the total metal contained in the piezoelectric material and $C_L$ was 9.35 mol % relative to all the metals contained in the piezoelectric material. In other words, $C_H<C_L$ held true.

A pair of piezoelectric elements was prepared by using the piezoelectric materials and then a vibration device for dust removal was prepared by using the piezoelectric elements. Thereafter, an image pickup unit was prepared by using the vibration device and driven to operate to evaluate the dust removal rate as in Example 1. As a result, the dust removal rate was 99% at 50° C. (relative humidity 90%), 99% at 23° C. (relative humidity 50%) and 99% at −20° C. (relative humidity not higher than 10%). In other words, it showed an excellent dust removal rate of not lower than 95% in the temperature range between −20° C. and 50° C.

Comparative Example 1

A pair of piezoelectric materials 431 (material B in FIG. 8) whose temperatures $T_1$ and $T_2$ that maximized their piezoelectric constants were equally −20° C. were prepared by adjusting the mixing ratio of barium titanate, calcium titanate and calcium zirconate and the weight parts of Mn contained in the PVA binder as described above for Example 1. Then, a pair of piezoelectric elements was prepared from the piezoelectric materials by using the element preparing method same as the one used in Example 1.

Both of the content ratios $C_H$ and $C_L$ of Ca contained in the piezoelectric materials were equal to 7.0 mol % relative to all the metals contained in the piezoelectric materials.

An image pickup unit was prepared by using the piezoelectric elements and driven to operate to evaluate the dust removal rate thereof as in Example 1. As a result, the dust removal rate was 88% at 50° C. (relative humidity 90%), 93% at 23° C. (relative humidity 50%) and 99% at −20° C. (relative humidity not higher than 10%). In other words, it showed a poor dust removal rate that did not get to the target value of 95% both at 23° C. and at 50° C. in the operating temperature range between −20° C. and 50° C. of the image pickup unit.

Comparative Example 2

A pair of piezoelectric materials 431 (material A in FIG. 8) whose temperatures $T_1$ and $T_2$ that maximized their piezoelectric constants were equally 20° C. were prepared by adjusting the mixing ratio of barium titanate, calcium titanate and calcium zirconate and the weight parts of Mn contained in the PVA binder as described above for Example 1. Then, a pair of piezoelectric elements was prepared from the piezoelectric materials by using the element preparing method same as the one used in Example 1.

Both of the content ratios $C_H$ and $C_L$ of Ca contained in the piezoelectric materials were equal to 4.0 mol % relative to all the metals contained in the piezoelectric materials.

An image pickup unit was prepared by using the piezoelectric elements and driven to operate to evaluate the dust removal rate thereof as in Example 1. As a result, the dust removal rate was 90% at 50° C. (relative humidity 90%), 99% at 23° C. (relative humidity 50%) and 96% at −20° C. (relative humidity not higher than 10%). In other words, it showed a poor dust removal rate that did not get to the target value of 95% in the operating temperature range between −20° C. and 50° C. of the image pickup unit.

Figure 9:
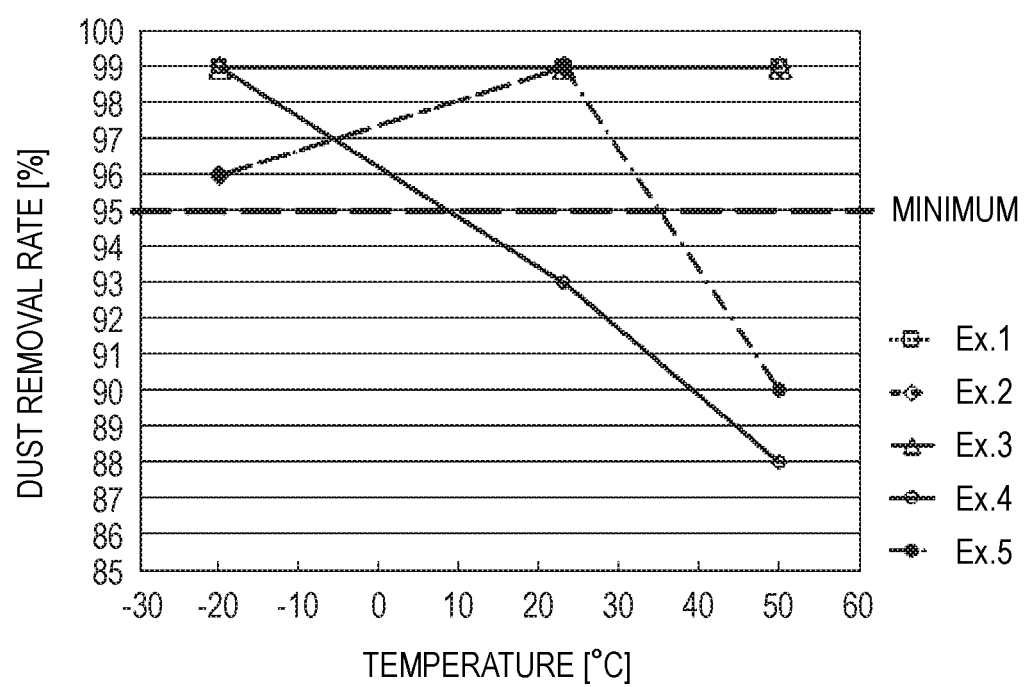
FIG. 9 is a graph illustrating the relationship between the dust removal rate of an embodiment of vibration device according to the present invention and the operating temperature of the device.

Table 1 and FIG. 9 show the results obtained in the examples and the comparative examples.

Since a pair of piezoelectric materials showing the same piezoelectric characteristics were employed both in Comparative Example 1 and Comparative Example 2, the value of $T_1$ is shown for both Tmax and Tmin of these comparative examples.

TABLE 1

|  |  | Example 1 | Example 2 | Example 3 | Comp Ex 1 | Comp Ex 2 |
| --- | --- | --- | --- | --- | --- | --- |
| $\Delta T(T_{max} - T_{min})$ [° C.] | | 40 | 10 | 100 | 0 | 0 |
| $T_{max}$ [° C.] | | 20 | 30 | 60 | −20 | 20 |
| $T_{min}$ [° C.] | | −20 | 20 | −40 | −20 | 20 |
| *1 | $C_H$ | 4 | 3.5 | 2 | 7 | 4 |
|  | $C_L$ | 7 | 4 | 9.35 | 7 | 4 |
| dust removal rate [%] | −20° C. | 99 | 96 | 99 | 99 | 96 |
|  | 23° C. | 99 | 99 | 99 | 93 | 99 |
|  | 50° C. | 99 | 99 | 99 | 88 | 90 |

*1) content ratios [mol %] of Ca contained in piezoelectric elements

INDUSTRIAL APPLICABILITY

Since a dust removal device according to the present invention can satisfactorily remove the foreign object such as dusts adhering to the surface of the vibrating plate thereof, it can find applications in various imaging devices and electric apparatus such as video digital cameras, copying machines, fax machines and scanners.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-019222, filed Feb. 6, 2018, which is hereby incorporated by reference herein in its entirety.

What is claimed is:

1. A vibration device comprising a vibrating member having at least n piezoelectric elements arranged on a vibrating plate, each of the piezoelectric elements being formed by using a lead-free piezoelectric material and electrodes,
  wherein, if a temperature that maximizes a piezoelectric constant of the piezoelectric material of each of the n piezoelectric elements is expressed as $T_m$, at least two of $T_1$ through $T_n$ differ from each other,
  where n≥2, and m is a natural number from 1 to n.

2. The vibration device according to claim 1, wherein a difference between a largest value and a smallest value of $T_1$ through $T_n$ is 10° C. to 100° C.

3. The vibration device according to claim 1, wherein the vibration device is structured so that vibrations take place on a surface of the vibrating member as an alternating voltage is applied to each of the n piezoelectric elements.

4. The vibration device according to claim 1, wherein a largest value and a smallest value of $T_1$ through $T_n$ are respectively not higher than 60° C. and not lower than −40° C.

5. The vibration device according to claim 1, wherein all of the n piezoelectric elements are arranged on a same surface side of the vibrating plate.

6. The vibration device according to claim 1, wherein all of the n piezoelectric elements are separated from each other and arranged on a surface of the vibrating plate.

7. The vibration device according to claim 1, wherein the lead-free piezoelectric material is a barium titanate-based material.

8. The vibration device according to claim 7, wherein the lead-free piezoelectric material further includes Ca, and
  wherein $C_H < C_L$,
  where $C_H$ is a content ratio of Ca in the piezoelectric material that shows a largest value of $T_1$ through $T_n$ and $C_L$ is a content ratio of Ca in the piezoelectric material that shows a smallest value of $T_1$ through $T_n$.

9. A dust removal device comprising the vibration device according to claim 1.

10. An imaging device comprising the vibration device according to claim 1 and an image pickup device unit, a light receiving surface side of the image pickup device unit being provided with the vibrating member of the vibration device.

11. An electric apparatus comprising the vibration device according to claim 1.

* * * * *